(12) United States Patent
Kong et al.

(10) Patent No.: US 11,949,416 B2
(45) Date of Patent: Apr. 2, 2024

(54) COMPOSITE LOGIC GATE CIRCUIT

(71) Applicant: SHENZHEN MICROBT ELECTRONICS TECHNOLOGY CO., LTD., Guangdong (CN)

(72) Inventors: Weixin Kong, Guangdong (CN); Dong Yu, Guangdong (CN); Wenbo Tian, Guangdong (CN); Zhijun Fan, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/272,236

(22) PCT Filed: Jan. 12, 2022

(86) PCT No.: PCT/CN2022/071540
§ 371 (c)(1),
(2) Date: Jul. 13, 2023

(87) PCT Pub. No.: WO2022/161167
PCT Pub. Date: Aug. 4, 2022

(65) Prior Publication Data
US 2024/0039540 A1    Feb. 1, 2024

(30) Foreign Application Priority Data

Jan. 26, 2021 (CN) .......................... 202110105646.6

(51) Int. Cl.
*H03K 19/21* (2006.01)
*H03K 19/0948* (2006.01)

(52) U.S. Cl.
CPC ......... *H03K 19/21* (2013.01); *H03K 19/0948* (2013.01)

(58) Field of Classification Search
None
See application file for complete search history.

(56) References Cited

U.S. PATENT DOCUMENTS 4,558,237 A * 12/1985 Rabe ................ H03K 3/356104
327/543
7,525,361 B2   4/2009 Kim
(Continued)

FOREIGN PATENT DOCUMENTS

CN    100505543 C    6/2009
CN    101547004 A    9/2009
(Continued)

OTHER PUBLICATIONS

International Search Report and Written Opinion for PCT/CN2022/071540 dated Mar. 1, 2022 (5 pages including English Translation).
(Continued)

*Primary Examiner* — Jany Richardson
(74) *Attorney, Agent, or Firm* — Merchant & Gould P.C.

(57) ABSTRACT

The present disclosure relates to a composite logic gate circuit, including: a simple logic gate circuit including a first logic gate circuit and an inverter circuit, a first PMOS transistor, and a first NMOS transistor. The first logic gate circuit is configured to receive a first input signal and a second input signal, and to output a first output signal. The inverter circuit includes a second PMOS transistor and a second NMOS transistor. A source of the second PMOS transistor is coupled to a power input terminal, a drain is coupled to a drain of the second NMOS transistor, and a gate is configured to receive the first output signal. A source of the second NMOS transistor is coupled to a ground terminal, and a gate is configured to receive the first output signal. A source of the first PMOS transistor is coupled to the drain of the second PMOS transistor, a drain is coupled to a drain of the first NMOS transistor, and a gate is configured to receive
(Continued)

a third input signal. A source of the first NMOS transistor is configured to receive the first output signal, and a gate is configured to receive the third input signal. The simple logic gate circuit is an AND or OR gate circuit, and the first logic gate circuit is a NAND or NOR gate circuit.

5 Claims, 5 Drawing Sheets

(56) References Cited

U.S. PATENT DOCUMENTS

| | | | |
|---|---|---|---|
| 10,177,768 B2 | 1/2019 | Iyengar et al. | |
| 10,924,118 B1 * | 2/2021 | Wang | H03K 19/01742 |
| 2004/0090243 A1 | 5/2004 | Kim | |
| 2009/0302893 A1 | 12/2009 | Singh | |
| 2022/0269481 A1 * | 8/2022 | Fan | G06F 7/501 |

FOREIGN PATENT DOCUMENTS

| | | |
|---|---|---|
| CN | 104836570 A | 8/2015 |
| CN | 109802671 A | 5/2019 |
| CN | 111313889 A | 6/2020 |
| CN | 214069906 U | 8/2021 |

OTHER PUBLICATIONS

Written Opinion for PCT/CN2022/071540 dated Mar. 1, 2022 (7 pages with English Translation).
TW Office Action dated Sep. 23, 2022 for Application No. 111101271 (7 pages including English Translation).
TW Search Report dated Sep. 23, 2022 for Application No. 111101271 (1 pages including English Translation).

* cited by examiner

COMPOSITE LOGIC GATE CIRCUIT

CROSS-REFERENCE TO RELATED APPLICATIONS

This application is a National Stage Application of International Application No. PCT/CN2022/071540, filed 12 Jan. 2022, which claims benefit of Serial No. 202110105646.6, filed 26 Jan. 2021 in China, and which applications are incorporated herein by reference. To the extent appropriate, a claim of priority is made to each of the above disclosed applications.

TECHNICAL FIELD

The present disclosure relates to a composite logic gate circuit, and in particular, to a composite logic gate circuit such as an OR-XOR gate circuit, an AND-XNOR gate circuit, or an OR-XNOR gate circuit and a low-power AND-XOR gate circuit based on the transistor-level.

BACKGROUND

With the continuous reduction of the integrated circuit process size and the rapid development of the design technology, the integrated circuit is becoming larger and more complex. The power consumption becomes one of the serious challenges in the development of the integrated circuit. Currently, almost all the digital circuits are designed based on the Boolean logic on a basis of the operation set of "AND", "OR" and "NOT", which may be referred to as the traditional Boolean (TB) logic. It can be recognized that the challenges in today's integrated circuit design are partly due to the limitation of the traditional Boolean logic itself. In fact, the digital circuit can be implemented with the traditional Boolean logic on a basis of the "AND", "OR" and "NOT" gate circuits, or may be implemented with a Reed-Muller (RM) logic such as the AND-XOR and OR-XOR based gate circuits.

Compared with the TB logic, the RM logic has the following advantages: (1) It is much easier to implement the logic functions such as the arithmetic operation and the parity check function using the RM logic than the TB logic. For example, for an n-variable parity checker, $2^n$ words are required to implement it using the TB logic, while only n words are required using the RM logic, which not only reduces the area of the silicon chip, but also has the potential advantages in power consumption and speed. (2) The RM logic has the good testability. (3) It is easy to map the RM logic circuit to the field programmable gate array (FPGA). This is because the XOR gate does not cause the additional area increase in the FPGA (such as a look-up table FPGA). The AND-XOR gate circuit is a common RM composite logic gate circuit, and is available for implementing the functions such as the arithmetic operation/the parity check, which has the advantages in costs and power consumption compared with implementation based on the simple logic gate circuits such as the "AND", "OR" and "NOT" gate circuits.

However, one of the reasons why the RM logic is not widely used in the industry as the TB logic is the lack of the low-power cell library suitable for the RM logic composite. In recent years, although there are researches on the AND-XOR gate circuit, they are all the structures obtained by cascading the AND gate circuit with the XOR/XNOR gate circuit, which has the problems such as large area, high power consumption, and the like.

Therefore, it is desired to provide a new AND-XOR gate circuit based on the transistor-level design and similar composite logic gate circuits that can reduce costs and power consumption.

SUMMARY

According to an aspect of the present disclosure, a composite logic gate circuit is provided. The composite logic gate circuit can include a simple logic gate circuit, a first PMOS transistor, and a first NMOS transistor; wherein the simple logic gate circuit can include a first logic gate circuit and an inverter circuit, wherein the first logic gate circuit can be configured to receive a first input signal and a second input signal, and to output a first output signal, wherein the inverter circuit can include a second PMOS transistor and a second NMOS transistor, a source of the second PMOS transistor is coupled to a power input terminal, a drain of the second PMOS transistor is coupled to a drain of the second NMOS transistor, a gate of the second PMOS transistor is configured to receive the first output signal, a source of the second NMOS transistor is coupled to a ground terminal, the drain of the second NMOS transistor is coupled to the drain of the second PMOS transistor, and a gate of the second NMOS transistor is configured to receive the first output signal, wherein a source of the first PMOS transistor is coupled to the drains of the second PMOS transistor and the second NMOS transistor, a drain of the first PMOS transistor is coupled to a drain of the first NMOS transistor, and a gate of the first PMOS transistor is configured to receive a third input signal, wherein a source of the first NMOS transistor is configured to receive the first output signal, the drain of the first NMOS transistor is coupled to the drain of the first PMOS transistor, and a gate of the first NMOS transistor is configured to receive the third input signal, and wherein the simple logic gate circuit can be an AND gate circuit or an OR gate circuit, and the first logic gate circuit may be a NAND gate circuit or a NOR gate circuit correspondingly.

Through the following detailed description of exemplary embodiments of the present disclosure with reference to the drawings, other features and advantages of the present disclosure will become clear.

BRIEF DESCRIPTION OF THE DRAWINGS

The drawings that constitute a part of the description illustrate embodiments of the present disclosure, and are used to explain the principle of the present disclosure together with the description.

The present disclosure may be understood more clearly according to the following detailed description with reference to the drawings.

It is to be noted that in the implementations illustrated below, sometimes the same reference numeral is used in different drawings to represent the same part or a part with the same function, and repeated illustration thereof is omitted. In the description, similar numbers and letters are used to represent similar items. Therefore, once an item is defined in a drawing, the item in subsequent drawings is not further discussed.

For ease of understanding, the locations, sizes, ranges, and the like of various structures shown in the drawings sometimes do not represent the actual locations, sizes, ranges, and the like. Therefore, the disclosed invention is not limited to the locations, the sizes, the ranges, and the like disclosed in the drawings. Moreover, the drawings are not necessarily drawn to scale, and some features may be exaggerated to show the details of specific components.

DETAILED DESCRIPTION

Various exemplary embodiments of the present disclosure will be described in detail with reference to the drawings now. It is to be noted that unless otherwise specified in detail, the relative deployment, the numerical expression, and values of the components and steps stated in these embodiments do not limit the scope of the present disclosure.

In fact, the following description of at least one exemplary embodiment is merely illustrative, and does not put any limitation on the present disclosure and the application or use thereof. That is, circuits and methods in the present disclosure are shown in an exemplary manner to describe different embodiments of the circuits or the methods in the present disclosure, and to not intend to impose limitations. One skilled in the art may understand that the circuits and the methods only illustrate the exemplary manner of implementing the present disclosure, rather than exhaustive manners.

Technologies, methods, and devices known to a person of ordinary skill in the related art may not be discussed in detail, but in proper circumstances, the technologies, methods, and devices shall be regarded as a part of the description.

Figure 1:
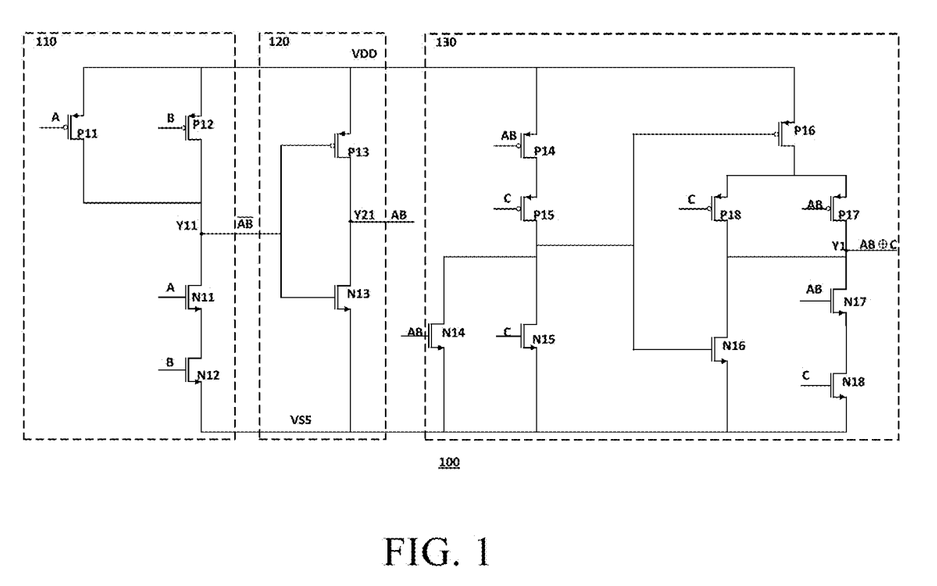
FIG. 1 schematically shows a structural diagram of a conventional AND-XOR gate circuit obtained by cascading a CMOS AND gate circuit with a CMOS XOR gate circuit based on the transistor-level design.

FIG. 1 schematically shows a structural diagram of a conventional AND-XOR gate circuit 100 obtained by cascading a CMOS AND gate circuit with a CMOS XOR gate circuit based on the transistor-level design.

In FIG. 1, the AND-XOR gate circuit 100 can be implemented by a common static complementary CMOS logic gate circuit. The function expression of the output signal of the AND-XOR gate circuit 100 at the output terminal Y1 can satisfy Y1=AB⊕C, wherein ⊕ represents XOR.

As shown in FIG. 1, the AND-XOR gate circuit 100 can include the NAND gate circuit 110, the INV (inverter) gate circuit 120, and the XOR gate circuit 130, wherein the NAND gate circuit 110 and the INV gate circuit 120 can form the CMOS AND gate circuit.

The NAND gate circuit 110 can include the PMOS transistors P11, P12, and the NMOS transistors N11, N12.

The NAND gate circuit 110 can receive the first input signal A at the gates of the PMOS transistor P11 and the NMOS transistor N11, receive the second input signal B at the gates of the PMOS transistor P12 and the NMOS transistor N12, and output the first output signal $\overline{AB}$ at the output terminal Y11 where the drains of the PMOS transistors P11, P12 and the NMOS transistor N11 are coupled to each other.

The INV gate circuit 120 can include the PMOS transistor P13 and the NMOS transistor N13. The INV gate circuit 120 can receive the first output signal $\overline{AB}$ at the gates of the PMOS transistor P13 and the NMOS transistor N13, and output the signal AB at the output terminal Y21 where the drains of the PMOS transistor P13 and the NMOS transistor N13 are coupled to each other.

Therefore, the NAND gate circuit 110 and the INV gate circuit 120 can form the AND gate circuit, and the AND operation value of the input signals is output at the output terminal of the AND gate circuit.

The XOR gate circuit 130 can include the NOR gate circuit and the AOI gate circuit. The NOR gate circuit can include the PMOS transistors P14, P15 and the NMOS transistors N14, N15, the input signal AB can be received at the gates of the PMOS transistor P14 and the NMOS transistor N14, and the input signal C can be received at the gates of the PMOS transistor P15 and the NMOS transistor N15. The AOI gate circuit can include the PMOS transistors P16, P17 and P18, and the NMOS transistors N16, N17 and N18, the input signal AB can be received at the gates of the PMOS transistor P17 and the NMOS transistor N17, the input signal C can be received at the gates of the PMOS transistor P18 and the NMOS transistor N18, and the signal AB⊕C is output at the output terminal YT.

In the AND-XOR gate circuit 100 shown in FIG. 1, the transistor is regarded as a switch controlled by its gate terminal signal. The AND-XOR gate circuit 100 formed by the static complementary CMOS gate circuit has the following advantages: high noise tolerance, low output impedance, high input impedance, no static power consumption, and the like. However, it can be seen from FIG. 1 that the AND-XOR gate circuit 100 formed by the static complementary CMOS gate circuits uses 16 transistors in total, which has a large area and power consumption.

The applicant recognizes that the XOR gate circuit 130 in the above design is composed of the NOR gate circuit and the AOI gate circuit, which uses 10 transistors P14-P18 and N14-N18. The applicant considers that the implementation based on the pass transistor logic (PTL) has the advantages of low power consumption and small transistor number. Specifically, in the case that the pass transistor logic is employed, the gate and the source/drain terminals are driven by the original input to reduce the number of the transistors required. That is, the input signal can not only control the gate terminal of the transistor, but also drive the source/drain terminal. Specifically, in the case that the pass transistor logic is employed, the XOR gate circuit can be implemented using 4 transistors.

Figure 2:
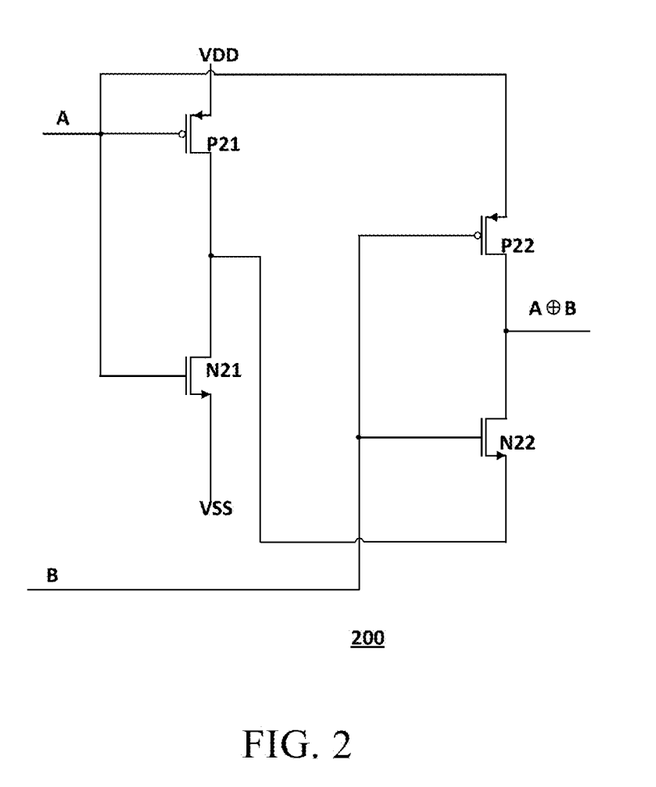
FIG. 2 schematically shows a structural diagram of an XOR gate circuit implemented by the pass transistor logic.

FIG. 2 schematically shows a structural diagram of an XOR gate circuit 200 implemented by the pass transistor logic.

As shown in FIG. 2, the XOR gate circuit 200 can include the PMOS transistors P21, P22 and the NMOS transistors N21, N22, wherein the PMOS transistor P21 and the NMOS transistor N21 can form the inverter circuit. The gate of the PMOS transistor P21 receives the input signal A, the source of the PMOS transistor P21 is coupled to the power input terminal VDD, and the drain of the PMOS transistor P21 is coupled to the drain of the NMOS transistor N21. The gate of the NMOS transistor N21 receives the input signal A, the drain of the NMOS transistor N21 is coupled to the drain of the PMOS transistor P21, and the source of the NMOS transistor N21 is coupled to the ground terminal VSS. The source of the PMOS transistor P22 is coupled to the gate of the PMOS transistor P21 and receives the input signal A, the gate of the PMOS transistor P22 is coupled to the gate of the NMOS transistor and receives the input signal B, and the drain of the PMOS transistor P22 is coupled to the drain of the NMOS transistor N22. The gate of the NMOS transistor N22 is coupled to the gate of the PMOS transistor P22 and receives the input signal B, the drain of the NMOS transistor N22 is coupled to the drain of the PMOS transistor P22, and the source of the NMOS transistor N22 is coupled to the drains of the NMOS transistor N21 and the PMOS transistor P21. The XOR gate circuit 200 formed thereby can output the signal A⊕B as the XOR value of the input signals A and B at the output terminal.

In the AND-XOR gate circuit 100 shown in FIG. 1, the CMOS AND gate circuit can include the NAND gate circuit 110 and the INV gate circuit 120, and includes 6 transistors, whereas in the XOR gate circuit 200 shown in FIG. 2, the XOR gate circuit 200 includes 4 transistors. Therefore, if the CMOS AND gate circuit in FIG. 1 is directly combined with the XOR gate circuit in FIG. 2, the AND-XOR gate circuit composed of 10 transistors can be formed. However, the applicant recognizes that the CMOS AND gate circuit in FIG. 1 can include the INV gate circuit formed by the PMOS transistor P13 and the NMOS transistor 13, and the XOR gate circuit 200 in FIG. 2 can include the inverter circuit formed by the PMOS transistor P21 and the NMOS transistor N21. Therefore, the applicant recognizes that by using the INV gate circuit formed by the PMOS transistor P13 and the NMOS transistor N13 which is a part of the AND gate circuit in FIG. 1 as the inverter circuit formed by the PMOS transistor P21 and the NMOS transistor N21 shown in FIG. 2 and changing the corresponding signal connection manner, only the transistors corresponding to the PMOS transistor P22 and the NMOS transistor N22 in FIG. 2 need to be added in FIG. 1, and the AND-XOR gate circuit can be implemented by adding only two transistors compared with the AND gate circuit in FIG. 1. That is, the AND-XOR gate circuit can be implemented with only 6 transistors.

Certainly, one skilled in the art can understand that when the NAND gate circuit in the AND-XOR gate circuit 100 in FIG. 1 is replaced with the NOR gate circuit, the OR-XOR gate circuit can be implemented by adding only two transistors to the OR gate circuit according to the concept of the present disclosure.

Figure 3:
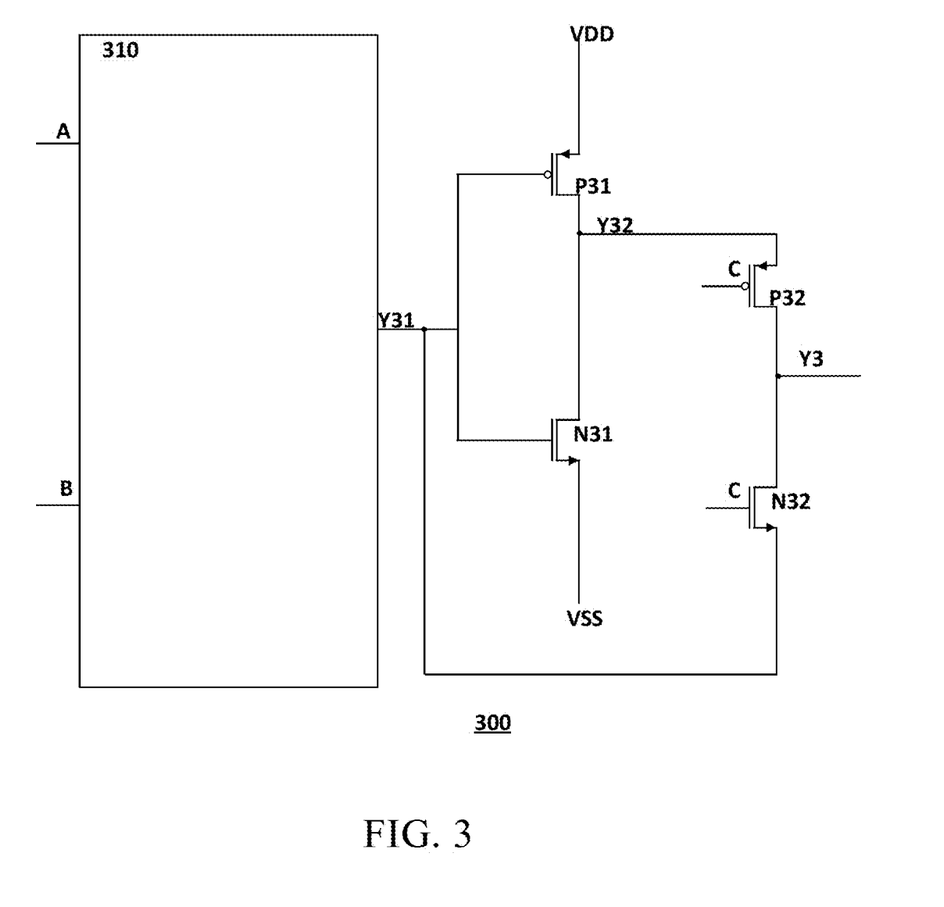
FIG. 3 schematically shows a structural diagram of a composite logic gate circuit based on the transistor-level design according to an embodiment of the present disclosure.

FIG. 3 schematically shows a structural diagram of a composite logic gate circuit 300 based on the transistor-level design according to an embodiment of the present disclosure.

As shown in FIG. 3, the composite logic gate circuit 300 can include the simple logic gate circuit, the PMOS transistor P32 (corresponding to the first PMOS transistor), and the NMOS transistor N32 (corresponding to the first NMOS transistor), wherein the simple logic gate circuit can include the first logic gate circuit 310 and the inverter circuit formed by the PMOS transistor P31 (corresponding to the second PMOS transistor) and the NMOS transistor N31 (corresponding to the second NMOS transistor).

The first logic gate circuit 310 can be configured to receive the first input signal A and the second input signal B, and to output the first output signal at the output terminal Y31. The source of the PMOS transistor P31 in the inverter circuit is coupled to the power input terminal VDD, the drain of the PMOS transistor P31 is coupled to the output terminal Y32, and the gate of the PMOS transistor P31 is configured to be coupled to the output terminal Y31 to receive the first output signal. The source of the NMOS transistor N31 in the inverter circuit is coupled to the ground terminal VSS, the drain of the NMOS transistor N31 is coupled to the output terminal Y32, and the gate of the NMOS transistor N31 is configured to be coupled to the output terminal Y31 to receive the first output signal.

The source of the PMOS transistor P32 is coupled to the drain of the PMOS transistor P31 instead of being coupled to the gate of the PMOS transistor P21 as shown in FIG. 2, the drain of the PMOS transistor P32 is coupled to the output terminal Y3, and the gate of the PMOS transistor P32 is configured to receive the third input signal C. The source of the NMOS transistor N32 is coupled to the gate of the PMOS transistor P31 instead of being coupled to the drain of the PMOS transistor P21 as shown in FIG. 2, the drain of the NMOS transistor N32 is coupled to the output terminal Y3, and the gate of the NMOS transistor N32 is configured to receive the third input signal C. By changing the connection manner in such a way, the AND/OR-XOR circuit can still be implemented, although the inverter formed by 2 transistors is absent compared with the direct combination of the CMOS AND gate circuit in FIG. 1 and the XOR gate circuit in FIG. 2.

In addition, the first logic gate circuit 310 can be the NAND gate circuit or the NOR gate circuit. In the case that the first logic gate circuit 310 is the NAND gate circuit, the above simple logic gate circuit can be the AND gate circuit, and the composite logic gate circuit 300 can be the AND-XOR gate circuit. And in the case that the first logic gate circuit 310 is the NOR gate circuit, the above simple logic gate circuit can be the OR gate circuit, and the composite logic gate circuit 300 can be the OR-XOR gate circuit. Generally, the first logic gate circuit 310 can be formed by 4 transistors. In the following, the description is made by taking the first logic gate circuit 310 is the NAND gate circuit as an example.

When the first logic gate circuit 310 is the NAND gate circuit, the first output signal at the output terminal Y31 is $\overline{AB}$, and the output signal at the output terminal Y32 is AB, thereby the output signal at the output terminal Y3 can be $AB\overline{C}+\overline{AB}C=AB\oplus C$, and the output signal at the output terminal Y3 conforms to the following truth table.

| Input signal | | | Output signal |
|---|---|---|---|
| A | B | C | Y3 |
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 0 |

It can be learned that in the composite logic gate circuit 300 as the AND-XOR gate circuit or the OR-XOR gate circuit, by borrowing the inverter in the AND gate circuit or the OR gate circuit, the AND-XOR gate circuit or the NOR-XOR gate circuit can be implemented by adding only two transistors compared with the AND gate circuit or the OR gate circuit, as shown in FIG. 3. As such, the AND-XOR gate circuit or the NOR-XOR gate circuit is implemented by using only 8 transistors, which is 50% less than that in the original design shown in FIG. 1, thereby reducing the area and the power consumption of the AND-XOR gate circuit or the NOR-XOR gate circuit.

In the above embodiment, the logic function can be implemented with the least transistors through the pass transistor logic, but there is the problem of non-full swing of the node signal. In FIG. 3, when AB=0 at the output terminal Y32, since the PMOS transistor P32 has a weak ability to transmit 0 and the NMOS transistor N32 has a weak ability to transmit 1, when C=0, Y3=0+Vthp (weak 0), and when C=1, Y3=VDD−Vthn (weak 1). The output node Y3 has a threshold loss, which causes the large delay and reduces the noise margin in the low-voltage application.

Figure 4:
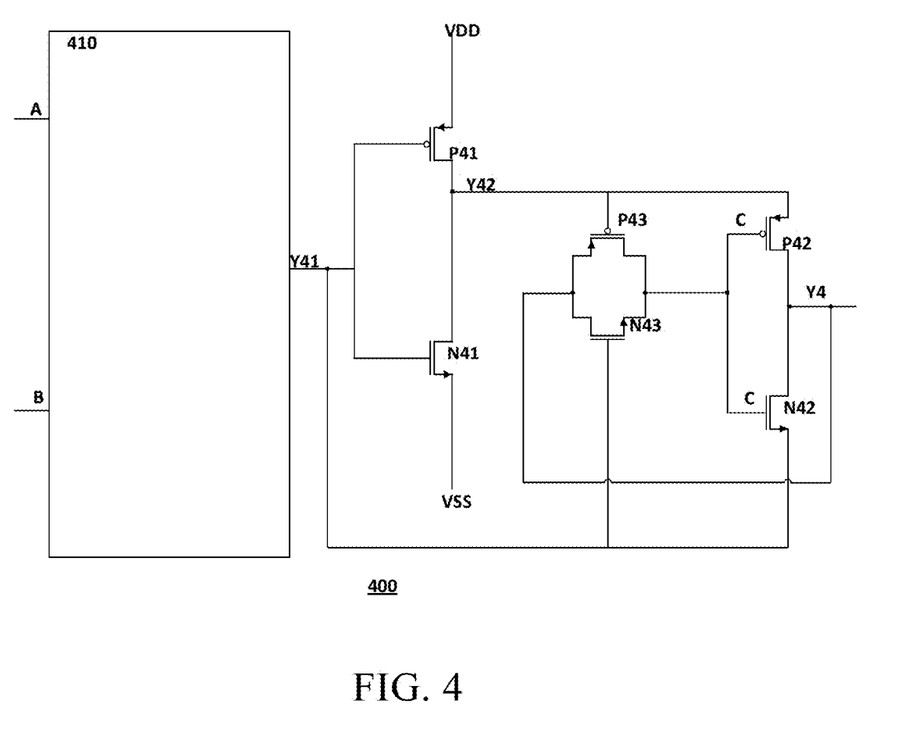
FIG. 4 schematically shows a structural diagram of a composite logic gate circuit based on the transistor-level design according to some other embodiments of the present disclosure.

FIG. 4 schematically shows a structural diagram of a composite logic gate circuit 400 based on the transistor-level design according to some other embodiments of the present disclosure.

As shown in FIG. 4, by adding the transmission gate composed of the PMOS transistor P43 (corresponding to the third PMOS transistor) and the NMOS transistor N43 (corresponding to the third NMOS transistor), the output is directly given through the transmission gate when AB=0 at the output terminal Y42, Y4=C, so that the problem of non-full swing can be avoided.

In some embodiments, the gate of the PMOS transistor P43 is coupled to the output terminal Y42, the source of the PMOS transistor P43 is coupled to the output terminal Y4, and the drain of the PMOS transistor P43 is coupled to the gates of the PMOS transistor P42 and the NMOS transistor N42, and is configured to receive the input signal C. The source of the NMOS transistor N43 is coupled to the gates of the PMOS transistor P42 and the NMOS transistor N42, and is configured to receive the input signal C, the drain of the NMOS transistor N43 is coupled to the output terminal Y4, and the gate of the NMOS transistor N43 is coupled to the output terminal Y41 to receive the first output signal of the first logic gate circuit 410.

As described above, the first logic gate circuit 410 can be the NAND gate circuit or the NOR gate circuit, and is generally composed of 4 transistors. Therefore, in FIG. 4, using 10 transistors is implemented, which is 37.5% less than the 16 transistors in the original design shown in FIG. 1.

Thus, in the conventional design, the AND-XOR gate circuit implemented by the common static complementary CMOS logic gate circuit uses more transistors (for example, 16), the area and the power consumption are large. In the present disclosure, in the design of the AND-XOR gate circuit or the OR-XOR gate circuit, by borrowing the inverter in the AND gate circuit or the OR gate circuit, the AND-XOR circuit or the OR-XOR gate circuit can be implemented by adding only 2 transistors. In order to solve the problem of non-full swing of the node signal, the transmission gate circuit can be added, so as to implement the AND-XOR circuit or the OR-XOR gate circuit by, for example, 10 transistors, thereby reducing the area and the power consumption of the AND-XOR gate circuit or the NOR-XOR gate circuit.

In addition, the present disclosure is not limited thereto. The above method is also applicable to a similar composite logic gate circuit, such as the AND-XNOR gate circuit or the OR-XNOR gate circuit and so on.

Figure 5:
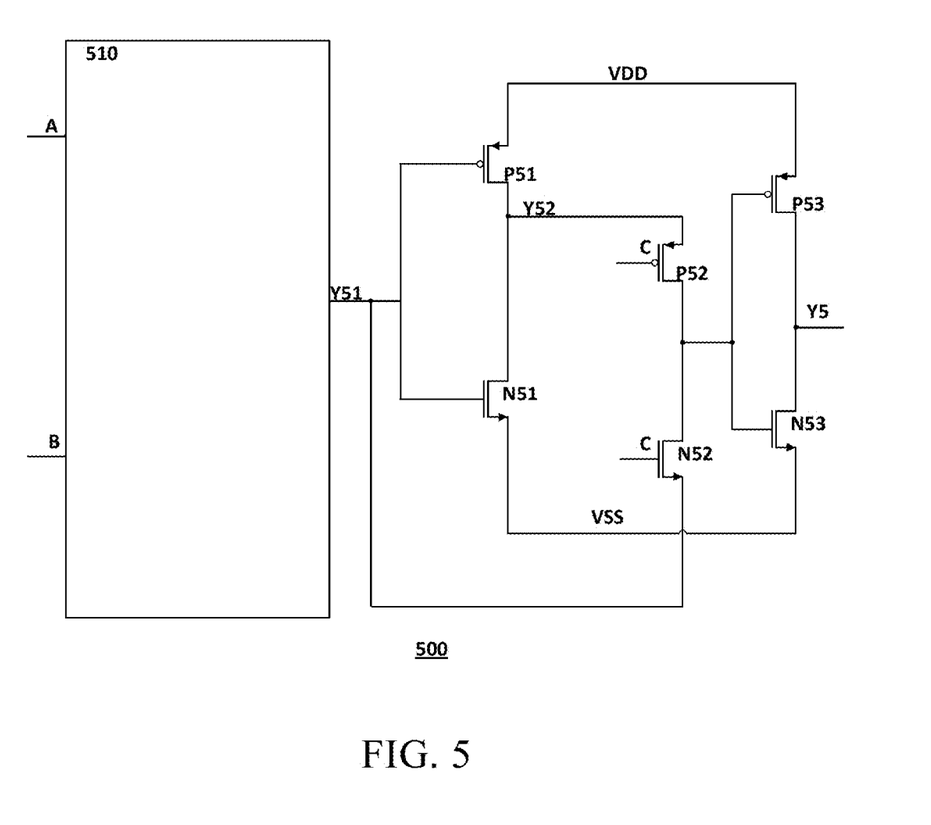
FIG. 5 schematically shows a structural diagram of another composite logic gate circuit based on the transistor-level design according to some other embodiments of the present disclosure.

FIG. 5 schematically shows a structural diagram of another composite logic gate circuit 500 based on the transistor-level design according to some other embodiments of the present disclosure.

In FIG. 5, compared with FIG. 3, the inverter circuit composed of the PMOS transistor P53 (corresponding to the fourth PMOS transistor) and the NMOS transistor N53 (corresponding to the fourth NMOS transistor) is added.

The source of the PMOS transistor P53 is coupled to the power input terminal VDD, the drain of the PMOS transistor P53 is coupled to the output terminal Y5, and the gate of the PMOS transistor P53 is coupled to the drains of the PMOS transistor P52 and the NMOS transistor N52. The source of the NMOS transistor N53 is coupled to the ground terminal VSS, the drain of the NMOS transistor N53 is coupled to the output terminal Y5, and the gate of the NMOS transistor N53 is coupled to the drains of the PMOS transistor P52 and the NMOS transistor N52. In the case that the first logic gate circuit 510 is the NAND gate circuit, the first output signal at the output terminal Y51 is $\overline{AB}$, the output signal at the output terminal Y52 is AB, and the output signal at the output terminal Y5 is ABC+$\overline{ABC}$=AB⊙C. Thereby, the composite logic gate circuit 500 in FIG. 5 can be the AND-XNOR gate circuit. Similarly, in the case that the first logic gate circuit 510 is the NOR gate circuit, the output signal at the output terminal Y5 can be (A+B)C+$\overline{A+B}$$\overline{C}$=(A+B)⊙C, and the composite logic gate circuit 500 in FIG. 5 can be the OR-XNOR gate circuit.

Figure 6A:
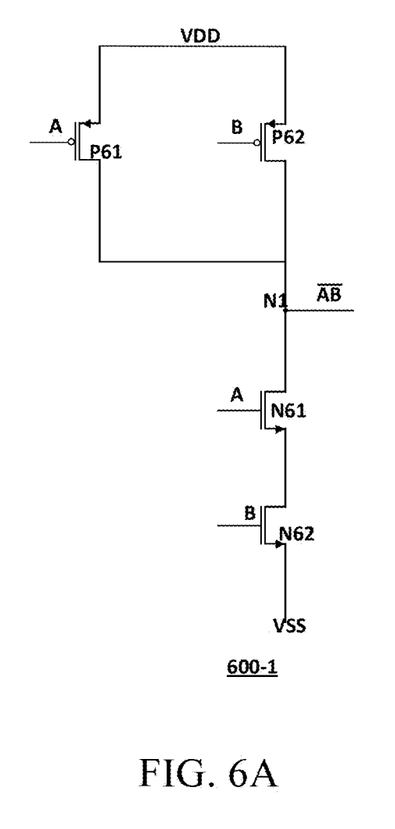
FIGS. 6A and 6B schematically show structural diagrams of a CMOS NAND gate circuit and a CMOS NOR gate circuit included in a composite logic gate circuit based on the transistor-level design according to an embodiment of the present disclosure respectively.
Figure 6B:
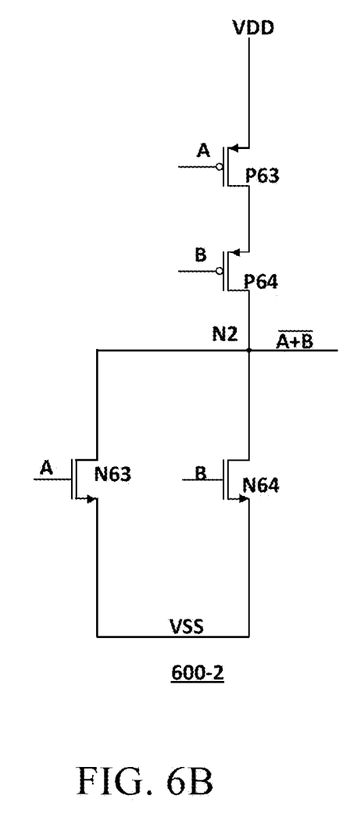

FIGS. 6A and 6B schematically show structural diagrams of a CMOS NAND gate circuit 600-1 and a CMOS NOR gate circuit 600-2 included in a composite logic gate circuit based on the transistor-level design according to an embodiment of the present disclosure respectively.

In some embodiments, the first logic gate circuits 310-510 shown in FIGS. 3-5 can be the NAND gate circuit shown in FIG. 6A. As shown in FIG. 6A, the NAND gate circuit 600-1 includes the PMOS transistor P61 (corresponding to the fifth PMOS transistor), the PMOS transistor P62 (corresponding to the sixth PMOS transistor), the NMOS transistor N61 (corresponding to the fifth NMOS transistor), and the NMOS transistor N62 (corresponding to the sixth NMOS transistor). The sources of the PMOS transistor P61 and the PMOS transistor P62 are both coupled to the power input terminal VDD, the drains of the PMOS transistor P61 and the PMOS transistor P62 are both coupled to the output terminal N1, the gate of the PMOS transistor P61 is configured to receive the first input signal A, and the gate of the PMOS transistor P62 is configured to receive the second input signal B. The source of the NMOS transistor N61 is coupled to the drain of the NMOS transistor N62, the drain of the NMOS transistor N61 is coupled to the output terminal N1, and the gate of the NMOS transistor N61 is configured to receive the first input signal A. The drain of the NMOS transistor N62 is coupled to the source of the NMOS transistor N61, the source of the NMOS transistor N62 is coupled to the ground terminal, and the gate of the NMOS transistor N62 is configured to receive the second input signal B. The NAND gate circuit 600-1 outputs the first output signal $\overline{AB}$ at the output terminal N1. In addition, the output terminal N1 in FIG. 6A may correspond to the output terminals Y31-Y51 in FIGS. 3-5.

As shown in FIG. 6B, the NOR gate circuit 600-2 includes the PMOS transistor P63 (corresponding to the seventh PMOS transistor), the PMOS transistor P64 (corresponding to the eighth PMOS transistor), the NMOS transistor N63 (corresponding to the seventh NMOS transistor), and the NMOS transistor N64 (corresponding to the eighth MOS transistor). The source of the PMOS transistor P63 is coupled to the power input terminal VDD, the drain of the PMOS transistor P63 is coupled to the source of the PMOS transistor P64, and the gate of the PMOS transistor P63 is configured to receive the first input signal A. The source of the PMOS transistor P64 is coupled to the drain of the PMOS transistor P63, the drain of the PMOS transistor P64 is coupled to the output terminal N2, and the gate of the PMOS transistor P64 is configured to receive the second input signal B. The sources of the NMOS transistor N63 and the NMOS transistor N64 are both coupled to the ground terminal VSS, the drains of the NMOS transistor N63 and the NMOS transistor N64 are both coupled to the output terminal N2, the gate of the NMOS transistor N63 is configured to receive the first input signal A, and the gate of the NMOS transistor N64 is configured to receive the second input signal B. The NOR gate circuit 600-2 can output the first output signal $\overline{A+B}$ at the output terminal N2. In addition, the output terminal N2 in FIG. 6B may correspond to the output terminals Y31-Y51 in FIGS. 3-5.

In all the examples shown and discussed herein, any specific value should be interpreted only as an example but not as a limitation. Therefore, other examples of the exemplary embodiments may have different values.

The advantages of the present disclosure are as follows: the number of the transistors in the circuit is reduced without affecting the performance of the circuit, which effectively reduces the power consumption of the circuit, and the circuit of the present disclosure is applicable to not only the circuits with the XOR logic function, but also the circuits with the XNOR logic function.

In some embodiments, a composite logic gate circuit is provided. The composite logic gate circuit includes a simple logic gate circuit, a first PMOS transistor, and a first NMOS transistor; wherein the simple logic gate circuit includes a first logic gate circuit and an inverter circuit, wherein the first logic gate circuit is configured to receive a first input signal and a second input signal, and to output a first output signal, wherein the inverter circuit includes a second PMOS transistor and a second NMOS transistor, a source of the second PMOS transistor is coupled to a power input terminal, a drain of the second PMOS transistor is coupled to a drain of the second NMOS transistor, a gate of the second PMOS transistor is configured to receive the first output signal, a source of the second NMOS transistor is coupled to a ground terminal, the drain of the second NMOS transistor is coupled to the drain of the second PMOS transistor, and a gate of the second NMOS transistor is configured to receive the first output signal, wherein a source of the first PMOS transistor is coupled to the drains of the second PMOS transistor and the second NMOS transistor, a drain of the first PMOS transistor is coupled to a drain of the first NMOS transistor, and a gate of the first PMOS transistor is configured to receive a third input signal, wherein a source of the first NMOS transistor is configured to receive the first output signal, the drain of the first NMOS transistor is coupled to the drain of the first PMOS transistor, and a gate of the first NMOS transistor is configured to receive the third input signal, and wherein the simple logic gate circuit is an AND gate circuit or an OR gate circuit, and the first logic gate circuit is a NAND gate circuit or a NOR gate circuit correspondingly.

In some embodiments, the composite logic gate circuit further includes a transmission gate circuit, the transmission gate circuit includes a third PMOS transistor and a third NMOS transistor, wherein a gate of the third PMOS transistor is coupled to the drain of the second PMOS transistor and the source of the first PMOS transistor, a source of the third PMOS transistor is coupled to the drains of the first PMOS transistor and the first NMOS transistor, and a drain of the third PMOS transistor is coupled to the gates of the first PMOS transistor and the first NMOS transistor, a gate of the third NMOS transistor is coupled to the source of the first NMOS transistor and is configured to receive the first output signal, a source of the third NMOS transistor is coupled to the gates of the first PMOS transistor and the first NMOS transistor, and a drain of the third NMOS transistor is coupled to the drains of the first PMOS transistor and the first NMOS transistor.

In some embodiments, the composite logic gate circuit further includes a second inverter circuit including a fourth PMOS transistor and a fourth NMOS transistor, wherein a source of the fourth PMOS transistor is coupled to the power input terminal, a drain of the fourth PMOS transistor is coupled to a drain of the fourth NMOS transistor, and a gate of the fourth PMOS transistor is coupled to the drains of the first PMOS transistor and the first NMOS transistor, a source of the fourth NMOS transistor is coupled to the ground terminal, the drain of the fourth NMOS transistor is coupled to the drain of the fourth PMOS transistor, and a gate of the fourth NMOS transistor is coupled to the drains of the first PMOS transistor and the first NMOS transistor.

In some embodiments, the first logic gate circuit is a NAND gate circuit including a fifth PMOS transistor, a fifth NMOS transistor, a sixth PMOS transistor, and a sixth NMOS transistor, wherein a source of the fifth PMOS transistor is coupled to the power input terminal, a drain of the fifth PMOS transistor is coupled to drains of the sixth PMOS transistor and the fifth NMOS, and a gate of the fifth PMOS transistor is configured to receive the first input signal, wherein a source of the sixth PMOS transistor is coupled to the power input terminal, the drain of the sixth PMOS transistor is coupled to the drains of the fifth PMOS transistor and the fifth NMOS transistor, and a gate of the sixth PMOS transistor is configured to receive the second input signal, wherein a source of the fifth NMOS transistor is coupled to a drain of the sixth NMOS transistor, the drain of the fifth NMOS transistor is coupled to the drains of the fifth PMOS transistor and the sixth PMOS transistor, and a gate of the fifth NMOS transistor is configured to receive the first input signal, wherein a source of the sixth NMOS transistor is coupled to the ground terminal, the drain of the sixth NMOS transistor is coupled to the source of the fifth NMOS transistor, and a gate of the sixth NMOS transistor is configured to receive the second input signal, wherein a node where the drains of the fifth PMOS transistor, the sixth PMOS transistor, and the fifth NMOS transistor are coupled to each other is configured to output the first output signal.

In some embodiments, the first logic gate circuit is a NOR gate circuit including a seventh PMOS transistor, a seventh NMOS transistor, an eighth PMOS transistor, and an eighth NMOS transistor, wherein a source of the seventh PMOS transistor is coupled to the power input terminal, a drain of the seventh PMOS transistor is coupled to a source of the eighth PMOS transistor, and a gate of the seventh PMOS transistor is configured to receive the first input signal, wherein the source of the eighth PMOS transistor is coupled to the drain of the seventh PMOS transistor, a drain of the eighth PMOS transistor is coupled to drains of the seventh NMOS transistor and the eighth NMOS transistor, and a gate of the eighth PMOS transistor is configured to receive the second input signal, wherein a source of the seventh NMOS transistor is coupled to the ground terminal, the drain of the seventh NMOS transistor is coupled to the drains of the eighth PMOS transistor and the eighth NMOS transistor, and a gate of the seventh NMOS transistor is configured to receive the first input signal, wherein a source of the eighth NMOS transistor is coupled to the ground terminal, the drain of the eighth NMOS transistor is coupled to the drains of the seventh NMOS transistor and the eighth PMOS transistor, and a gate of the eighth NMOS transistor is configured to receive the second input signal, wherein a node where the drains of the eighth PMOS transistor, the seventh NMOS transistor, and the eighth NMOS transistor are coupled to each other is configured to output the first output signal.

The terms "front", "rear", "top", "bottom", "above", "below" and the like in the description and in the claims, if any, are used for descriptive purposes and not necessarily for describing constant relative positions. It is to be understood that the terms used in such a way are interchangeable in proper circumstances so that embodiments of the present disclosure described herein can, for example, operate in other orientations different from those shown herein or otherwise described.

As used herein, a term "exemplary" means "used as an example, instance, or illustration", and is not intended to be a "model" to be accurately copied. Any implementation illustratively described herein is not necessarily to be construed as preferred or advantageous over other implementations. Moreover, the present disclosure is not limited by any expressed or implied principle given in the above technical field, background, summary, or detailed description.

As used herein, a term "substantially" is intended to encompass any minor variation caused by at least one of design or manufacturing defect, device or component tolerance, environmental influences, and other factors. The term "substantially" also allows for differences from a perfect or ideal situation due to parasitic effects, noise, and other practical considerations that may exist in a practical implementation.

The above description may indicate elements or nodes or features that are "coupled" or "coupling" together. As used herein, unless expressly stated otherwise, "coupled" means that one element/node/feature is directly connected (or directly communication) to another element/node/feature electrically, mechanically, logically, or in other manners. Similarly, unless expressly stated otherwise, "coupling" means that one element/node/feature may be directly or indirectly linked with another element/node/feature mechanically, electrically, logically or in other manners, to allow an interaction, even though the two features may not be directly connected. That is, "coupling" is intended to include direct or indirect connections between elements or other features, including couplings using one or more intermediate elements.

It is further to be understood that the term "comprise/include", when used herein, specifies the presence of at least one of stated features, integers, steps, operations, elements, and components, but does not preclude the presence or addition of at least one of one or more other features, integers, steps, operations, elements, and components, and/or combinations thereof.

One skilled in the art should recognize that the boundaries between the above operations is merely illustrative. A plurality of operations may be combined into a single operation, and a single operation may be distributed in an additional operation, and the operations may be performed at least partially overlapping in time. Moreover, alternative embodiments may include a plurality of examples of particular operations, and the operation sequence may be changed in other various embodiments. Other modifications, changes, and replacements, however, may also exist. Therefore, the description and drawings are to be regarded as illustrative rather than limited.

Despite the detailed illustration of some particular embodiments of the present disclosure by the examples, one skilled in the art should understand that the above examples are merely intended to describe rather than to limit the scope of the present disclosure. One skilled in the art should further understand that various changes may be made to the embodiments without departing from the scope and spirit of the present disclosure. The scope of the present disclosure is defined by the appended claims.

What is claimed is:

1. A composite logic gate circuit, comprising:
   a simple logic gate circuit, a first PMOS transistor, and a first NMOS transistor;
   wherein the simple logic gate circuit comprises a first logic gate circuit and an inverter circuit,
   wherein the first logic gate circuit is configured to receive a first input signal and a second input signal, and to output a first output signal,
   wherein the inverter circuit comprises a second PMOS transistor and a second NMOS transistor, a source of the second PMOS transistor is coupled to a power input terminal, a drain of the second PMOS transistor is coupled to a drain of the second NMOS transistor, a gate of the second PMOS transistor is configured to receive the first output signal, a source of the second NMOS transistor is coupled to a ground terminal, the drain of the second NMOS transistor is coupled to the drain of the second PMOS transistor, and a gate of the second NMOS transistor is configured to receive the first output signal,
   wherein a source of the first PMOS transistor is coupled to the drains of the second PMOS transistor and the second NMOS transistor, a drain of the first PMOS transistor is coupled to a drain of the first NMOS transistor, and a gate of the first PMOS transistor is configured to receive a third input signal,
   wherein a source of the first NMOS transistor is configured to receive the first output signal, the drain of the first NMOS transistor is coupled to the drain of the first PMOS transistor, and a gate of the first NMOS transistor is configured to receive the third input signal, and
   wherein the simple logic gate circuit is an AND gate circuit or an OR gate circuit, and the first logic gate circuit is a NAND gate circuit or a NOR gate circuit correspondingly.

2. The composite logic gate circuit according to claim 1, further comprising a transmission gate circuit, wherein the transmission gate circuit comprises a third PMOS transistor and a third NMOS transistor,
   wherein a gate of the third PMOS transistor is coupled to the drain of the second PMOS transistor and the source of the first PMOS transistor, a source of the third PMOS transistor is coupled to the drains of the first PMOS transistor and the first NMOS transistor, and a drain of the third PMOS transistor is coupled to the gates of the first PMOS transistor and the first NMOS transistor,
   a gate of the third NMOS transistor is coupled to the source of the first NMOS transistor and is configured to receive the first output signal, a source of the third NMOS transistor is coupled to the gates of the first PMOS transistor and the first NMOS transistor, and a drain of the third NMOS transistor is coupled to the drains of the first PMOS transistor and the first NMOS transistor.

3. The composite logic gate circuit according to claim 1, further comprising a second inverter circuit including a fourth PMOS transistor and a fourth NMOS transistor, wherein a source of the fourth PMOS transistor is coupled to the power input terminal, a drain of the fourth PMOS transistor is coupled to a drain of the fourth NMOS transistor, and a gate of the fourth PMOS transistor is coupled to the drains of the first PMOS transistor and the first NMOS transistor, a source of the fourth NMOS transistor is coupled to the ground terminal, the drain of the fourth NMOS transistor is coupled to the drain of the fourth PMOS transistor, and a gate of the fourth NMOS transistor is coupled to the drains of the first PMOS transistor and the first NMOS transistor.

4. The composite logic gate circuit according to claim 1, wherein the first logic gate circuit is a NAND gate circuit, the NAND gate circuit comprises:

a fifth PMOS transistor, a fifth NMOS transistor, a sixth PMOS transistor, and a sixth NMOS transistor, wherein a source of the fifth PMOS transistor is coupled to the power input terminal, a drain of the fifth PMOS transistor is coupled to drains of the sixth PMOS transistor and the fifth NMOS, and a gate of the fifth PMOS transistor is configured to receive the first input signal, wherein a source of the sixth PMOS transistor is coupled to the power input terminal, the drain of the sixth PMOS transistor is coupled to the drains of the fifth PMOS transistor and the fifth NMOS transistor, and a gate of the sixth PMOS transistor is configured to receive the second input signal, wherein a source of the fifth NMOS transistor is coupled to a drain of the sixth NMOS transistor, the drain of the fifth NMOS transistor is coupled to the drains of the fifth PMOS transistor and the sixth PMOS transistor, and a gate of the fifth NMOS transistor is configured to receive the first input signal, wherein a source of the sixth NMOS transistor is coupled to the ground terminal, the drain of the sixth NMOS transistor is coupled to the source of the fifth NMOS transistor, and a gate of the sixth NMOS transistor is configured to receive the second input signal, wherein a node where the drains of the fifth PMOS transistor, the sixth PMOS transistor, and the fifth NMOS transistor are coupled to each other is configured to output the first output signal.

5. The composite logic gate circuit according to claim 1, wherein the first logic gate circuit is a NOR gate circuit, the NOR gate circuit comprises:

a seventh PMOS transistor, a seventh NMOS transistor, an eighth PMOS transistor, and an eighth NMOS transistor, wherein a source of the seventh PMOS transistor is coupled to the power input terminal, a drain of the seventh PMOS transistor is coupled to a source of the eighth PMOS transistor, and a gate of the seventh PMOS transistor is configured to receive the first input signal, wherein the source of the eighth PMOS transistor is coupled to the drain of the seventh PMOS transistor, a drain of the eighth PMOS transistor is coupled to drains of the seventh NMOS transistor and the eighth NMOS transistor, and a gate of the eighth PMOS transistor is configured to receive the second input signal, wherein a source of the seventh NMOS transistor is coupled to the ground terminal, the drain of the seventh NMOS transistor is coupled to the drains of the eighth PMOS transistor and the eighth NMOS transistor, and a gate of the seventh NMOS transistor is configured to receive the first input signal, wherein a source of the eighth NMOS transistor is coupled to the ground terminal, the drain of the eighth NMOS transistor is coupled to the drains of the seventh NMOS transistor and the eighth PMOS transistor, and a gate of the eighth NMOS transistor is configured to receive the second input signal, wherein a node where the drains of the eighth PMOS transistor, the seventh NMOS transistor, and the eighth NMOS transistor are coupled to each other is configured to output the first output signal.

* * * * *